United States Patent [19]

Duncan

[11] 4,114,105
[45] Sep. 12, 1978

[54] NOISE BLANKER CIRCUIT

[75] Inventor: Herbert Alan Duncan, Schaumburg, Ill.

[73] Assignee: Motorola, Inc., Schaumburg, Ill.

[21] Appl. No.: 810,215

[22] Filed: Jun. 27, 1977

[51] Int. Cl.² .............................................. H04B 1/10
[52] U.S. Cl. .................................. 325/480; 325/319; 325/479; 325/402; 330/282
[58] Field of Search .............. 325/348, 349, 478, 479, 325/402, 403, 319, 410, 411–413, 482, 480; 330/86, 110, 282; 328/165

[56] References Cited

U.S. PATENT DOCUMENTS

| 3,140,445 | 7/1964 | Myers et al. | 325/478 |
| 3,140,446 | 7/1964 | Myers et al. | 325/478 |
| 3,167,721 | 1/1965 | Broadhead, Jr. | 325/482 |
| 3,223,936 | 12/1965 | Cook, Jr. | 330/282 |
| 3,500,067 | 3/1970 | Davis et al. | 330/282 |
| 3,699,457 | 10/1972 | Wright | 325/479 |

Primary Examiner—John C. Martin
Assistant Examiner—Jin F. Ng
Attorney, Agent, or Firm—James W. Gillman; Donald J. Lisa; Phillip H. Melamed

[57] ABSTRACT

A noise blanker circuit usable in a radio receiver is disclosed. Noise pulses in demodulated received signals are detected by a noise detector amplifier. These detected noise pulses are then processed by a control means which develops control signals that selectively control a blanking gate which is followed by a holding capacitor. The gate and holding capacitor combine to blank out noise in the demodulated signals in response to the production of the control signals. The control means includes an amplifier with an AC negative feedback loop that includes a varactor diode. A rectifier diode is used to develop a DC voltage proportional to the occurrence rate of noise pulses and this DC voltage biases the varactor diode such that noise blanking only occurs when the noise present on the received signal is below a predetermined rate of occurrence.

10 Claims, 1 Drawing Figure

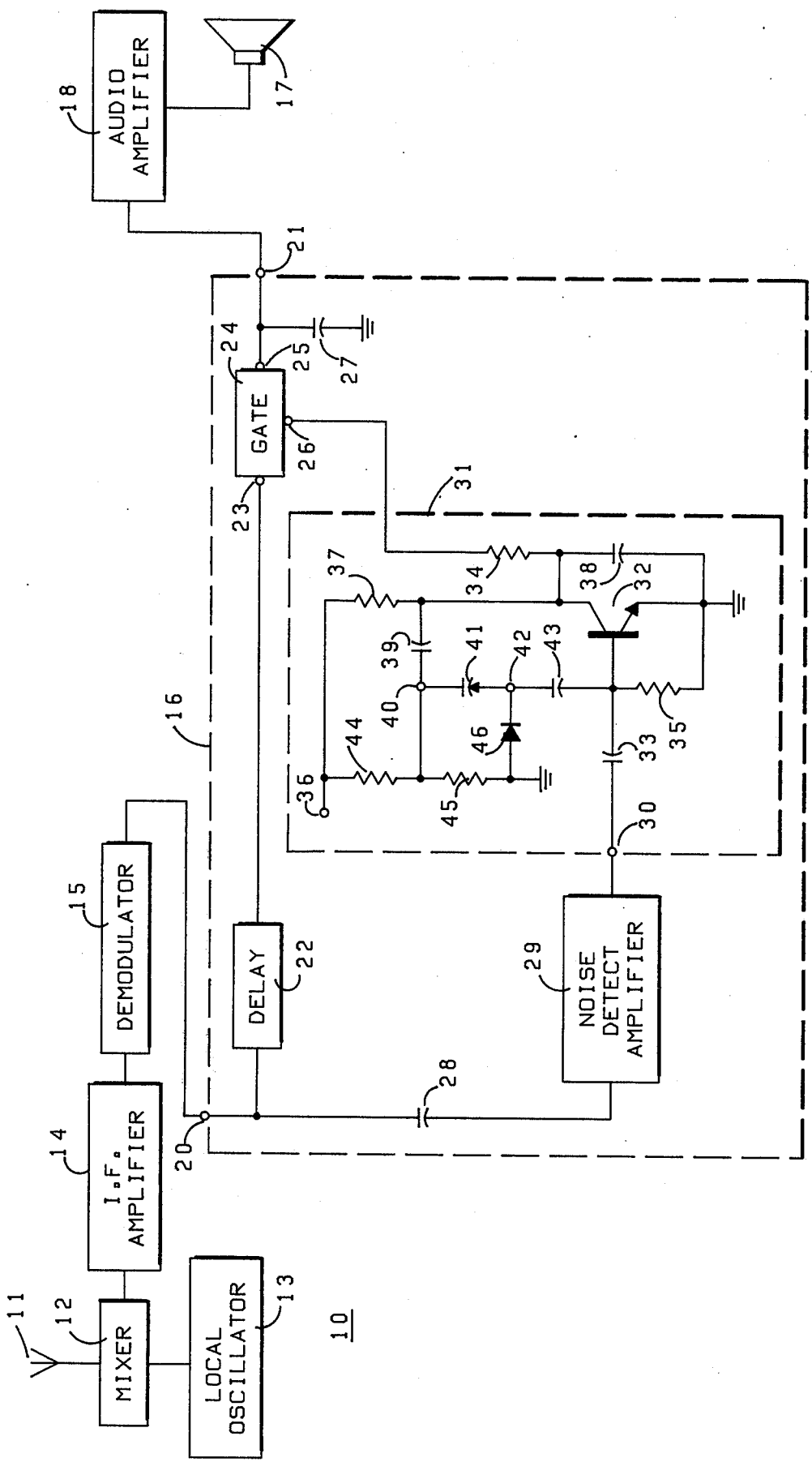

NOISE BLANKER CIRCUIT

BACKGROUND OF THE PRESENT INVENTION

The present invention generally relates to the field of noise blanking circuits and more particularly to the field of noise blanking circuits which are automatically disabled whenever noise disturbances are present and exceed a predetermined rate of occurrence.

Noise blanking circuits generally receive an information signal with noise pulses superimposed upon it. These prior art noise blanking circuits then selectively prevent the passage of the received signal in response to the detection of a noise pulse by a noise pulse detector circuit. In general, these prior art noise circuits provide for no automatic disabling of the noise blanking operation. Thus, if the noise pulses exceed some predetermined rate, the noise blanker may effectively blank out all of the received signal resulting in a total loss of information.

Some prior art noise blanking circuits have provided for automatically disabling the noise blanking operation whenever the detected noise pulses exceed a predetermined rate of occurrence. In this manner, at least some information is passed on even though a large amount of noise may be superimposed upon the information signal. These prior art automatic rate shut-off blankers generally function by altering the DC bias of an amplifying devise whose output creates the control signals that operate the blanker apparatus. Because of this, these prior art type blanking rate shut-off systems are not rapidly responsive to changes in the noise occurrence rate. This is because the changing of the DC bias of an amplifying device is generally gradually accomplished and the output of the ampilfying device is therefore only slowly responsive to changes in the noise occurrence rate.

SUMMARY OF THE PRESENT INVENTION

An object of the present invention is to provide an improved noise blanker circuit which overcomes the aforementioned deficiencies.

A further object of the present invention is to provide a noise blanker circuit having automatic rate shut-off circuitry that is rapidly responsive to changes in the noise occurrence rate.

In one embodiment of the present invention there is provided noise blanker circuitry for eliminating the noise in a received signal. This noise blanker circuitry comprises gate means for receiving a signal with noise pulses on it and selectively passing this received signal in accordance with control signals; noise detector means coupled to the gate means for detecting the noise pulses on said received signal and producing output signals in response to the detected noise pulses; and control means coupled to said noise detector means and said gate means for producing control signals in response to said output signals, said control means including an amplifier for producing said control signals as a function of its output, said amplifier having AC negative feedback circuitry including a voltage variable impedance, said control means also including rectifier circuitry for developing a DC voltage related to said output signals, said rectifier circuitry coupled to said voltage variable impedance for control thereof to substantially reduce the AC gain of said amplifier in response to the rate of said output signals being above a predetermined rate, whereby said gate control signals are produced for blanking noise only when the noise on said received signal has a noise occurrence rate below a predetermined rate. Preferably the voltage variable impedance is capacitively coupled in said feedback circuitry such that said DC voltage does not affect the bias of said amplifier. The voltage variable impedance is preferably a variable reactance such as a varactor diode.

BRIEF DESCRIPTION OF THE DRAWING

For a more complete understanding of the invention reference should be made to the drawing in which a radio receiver is illustrated which has a noise blanker circuit with automatic rate shut-off that is constructed in accordance with the present invention.

DESCRIPTION OF THE PREFERRED EMBODIMENT

A radio receiver 10 for receiving radio signals and producing audible signals in response thereto is illustrated in the accompanying drawing. The receiver includes an antenna 11 for receiving transmitted radio signals and coupling them to a mixer stage 12 which also receives an input from a local oscillator 13. The output of the mixer 12 is coupled to an IF amplifier 14 whose output is subsequently coupled to a demodulator circuit 15. The output of the demodulator, which is typically an audio signal, is coupled to a noise blanker circuit 16 (shown dashed) whose output is coupled to an audio speaker 17 through an audio amplifier 18. The construction and operation of the components 11 through 15 and 17 and 18 is well known to those of average skill in the art of radio design and will therefore not be discussed further.

The noise blanker circuit 16 receives audio demodulated signals at an input terminal 20 and selectively passes these received signals to its output terminal 21 which is coupled to the input of the audio amplifier 18. A delay circuit 22 is coupled between the input terminal 20 and an input terminal 23 of a controllable gate means 24 which has an output terminal 25 and a control terminal 26. The delay circuit 22 provides a predetermined amount of delay for signals passed between the input terminal 20 and the terminal 23. The output terminal 25 of the gate 24 is directly coupled to the output terminal 21 of the noise blanker and is also coupled to ground through an audio holding capacitor 27. The input terminal 20 is coupled through a differentiating capacitor 28 to a noise detector amplifier 29 which detects the noise pulses present in the signal at the terminal 20 and produces output signals in response thereto at an output terminal 30 that also serves as an input terminal to a control circuit 31 (shown dashed) which supplies control signals to the control terminal 26 of the gate 24.

Basically, the operation of the noise blanker 16 is as follows. Demodulated signals containing noise pulses are produced at the terminal 20 in response to the reception of a desired signal by the antenna 11. The noise detector amplifier 29 determines if any noise pulses are present in the signal at the terminal 20 and produces output signals at the terminal 30 if such noise pulses are detected. The detection of these noise pulses will generally result in the control circuit 31 producing a corresponding control signal which is then coupled to the control terminal 26. The production of the control signal will open the gate 24 such that no signal will be passed between the terminals 23 and 25. The time delay provided by the delay circuit 22 merely insures that the control signal produced by the control circuit 31 in response to the detection of a noise pulse will occur at the precise time that the received noise pulse reaches the terminal 23. Thus the delay circuit 22 merely compensates for the time required for the noise detector amplifier 29 to produce output signals in response to the occurrence of noise pulses at the terminal 20, and the time required for the control means 31 to respond to these output signals and produce a control signal.

Generally, the voltage at the terminals 21 and 25 will follow the voltage at the terminal 23 whenever the gate 24 is closed. However, when the gate 24 is opened, the holding capacitor 27 will maintain the voltage at the terminals 21 and 25 at its previous level until the gate 24 is subsequently closed. This can be accomplished by merely providing the audio amplifier 18 with a high input impedance and providing no low impedance discharge path for the capacitor 27 while the gate 24 is open. Blanker circuits comprising a controllable gate followed by a holding capacitor are known and therefore this feature of the present invention will not be discussed in detail. Preferably, the gate 24 comprises a transistor having its collector terminal directly connected to the terminal 23, its emitter terminal directly connected to the terminal 25 and its base terminal connected to the control terminal 26.

The construction of the control circcuit 31 will now be discussed in detail and subsequently its operation will be discussed with specific emphasis on the noise rate disabling feature provided by this control circuit.

The control circuit 31 includes an NPN amplifying transistor 32 having its emitter terminal directly connected to ground, its base terminal coupled to the input terminal 30 through a coupling capacitor 33 and its collector terminal coupled through an output resistor 34 to the control terminal 26. The base of the transistor 32 is coupled to ground by a resistor 35 which supplies zero bias to the base emitter junction of the transistor 32. A positive voltage supply terminal 36 is coupled through a load resistor 37 to the collector of the transistor 32 which is also coupled to ground through a capacitor 38. The transistor 32 has a negative AC capacitive feedback loop which includes a first coupling capacitor 39 coupled between the collector of the transistor 32 and a terminal 40. A varactor diode 41 is coupled between the terminal 40 and a terminal 42 with the anode of the diode 41 being connected to the terminal 42. A second coupling capacitor 43 is coupled between the base of the transistor 32 and the terminal 42. The components 39 through 43 represent a negative feedback loop which controls the AC gain of the transistor 32. Varactor diode 41 represents a voltage variable impedance which controls the amount of feedback.

A resistor 44 is coupled between the positive supply terminal 36 and the terminal 40, and a resistor 45 is coupled between the terminal 40 and ground. The resistors 44 and 45 form a resistor divider network which provides a slight positive voltage at the terminal 40 to reverse bias the varactor diode 41. A rectifying diode 46 is coupled between the terminal 42 and ground with the anode of the diode 46 directly connected to ground. The diode 46 produces a rectified DC voltage at the terminal 42 which is proportional to the rate noise and this DC voltage results in selectively biasing the varactor diode 41 so as to reduce the gain of the amplifying device 32 and thereby inactivate the control circuit 31 whenever noise pulses occur above a predetermined rate. This disabling operation will now be explained in more detail.

The noise detector amplifier 29 receives differentiated signals from the capacitor 28. Preferably, the noise detector 29 differentiates its received signals a second time and produces output signals which are positive and negative impulses that are representative of the occurrence of each noise pulse. These impulses are coupled through the capacitor 33 to the base of the transistor 32. Assuming that these impulses occur at a low rate, below a predetermine rate, the diode 46 will not produce any substantial positive voltage at the terminal 42. Therefore the varactor diode 41 will remain reverse biased to such an extent that the negative feedback loop comprising the capacitors 39 and 43 in series with the varactor diode 41 will have no appreciable effect upon the gain of the amplifying transistor 32. In other words, when the noise detector 29 produces output signal impulses at a low rate, the AC negative feedback loop will not deteriorate the gain of the amplifying device 32 at all since the varactor diode 41 will be substantially reverse biased and therefore have a very low capacitance value which results in substantially no AC feedback. In this condition, a positive impulse at the base of the transistor 32 will result in turning on the transistor 32 and totally discharging the capacitor 38. After the discharge of the capacitor 38 the resistor 37 will result in charging up this capacitor until the next positive impulse occurs at the base of the transistor 32. During the time that the voltage at the collector of the transistor 32 is at a substantially low voltage level, this time being determined by the charging constant which depends on the resistor 37 and the capacitor 38, a low control signal will be coupled by the resistor 34 to the control terminal 26 of the gate 24. This low control signal will result in opening up the gate 24 and thereby blanking the signal normally passed between the terminals 23 and 25. The delay means 22 insures that a noise pulse is received at the terminal 23 at the precise time that the control circuit 31 produces the low control signal at the terminal 26. The duration of the control signal is determined by the charging constant determined by the resistor 37 and the capacitor 38. Thus for low rates of noise related output impulses produced by the noise detector 29, the blanker circuit 16 functions as a standard noise blanker.

When the noise detector 29 produces noise related output inpulses above a predetermined rate, the diode 46 will receive these impulses through the capacitor 43. The diode 46 will shunt the negative received impulses to ground, but will effectively rectify the positive impulses and develop a positive DC voltage at the terminal 42 proportional to the rate of these positive impulses. This DC voltage at the terminal 42 will tend to reduce the reverse bias normally applied across the varactor diode 41. This will result in increasing the capacitance of the varactor diode and reducing its impedance thereby reducing the AC gain of the transistor 32 by providing a low impedance AC path from the collector of the transistor 32 to its base. The result of this is that the transistor 32 will have an extremely low gain whenever the noise detector 29 produces output impulses at a high rate above a predetermined minimum rate. This will, in effect, lower the gain of the transistor 32 such that positive impulses received by the transistor 32 will no longer be able to turn the transistor 32 on such that it can discharge the capacitor 38. The result of this is to effectively disable the control circuit 31 so that a low control signal which opens the gate 24 cannot be produced if noise pulses having a high rate of occurrence are detected by the noise detector 29.

It should be noted that the DC bias of the amplifying transistor 32 is not altered by the operation of the noise rate shut-off circuitry and the production of the DC voltage by the diode 46. This allows the control circuit 31 to rapidly respond to changes in the repetition rate of noise pulses. Also, by not altering the DC bias levels of the transistor amplifying device 32 which creates the control signal, a much more stable circuit is obtained.

In order to better understand the operation of the present circuit, it should be noted that the rectifying diode 46 essentially acts as a diode in parallel with a capacitor and a high resistance resistor, and in this manner produces a rectified DC voltage at the terminal 42 which is proportional to the repetition rate of the positive impulses it receives through the capacitor 43. The resistor 35 merely provides a nominal zero bias for the base emitter junction of the amplifying transistor 32.

While I have shown and described a specific embodiment of this invention, further modifications and improvements will occur to those skilled in the art. All such modifications which retain the basic underlying principles disclosed and claimed herein are within the scope of this invention.

I claim:

1. A noise blanker circuit for elimanating noise in a received signal, comprising:
   gate means for receiving a signal with noise pulses on it and selectively passing said received signal in accordance with control signals received by said gate means;
   noise detector means for detecting noise pulses having variable rates on said received signal and producing output signals having variable rates in response to the detected noise pulses; and
   control means including an amplifier coupled to said noise detector means and said gate means for producing said control signals in response to said output signals, said amplifier having AC negative feedback circuitry including a voltage variable impedance, said control means also including rectifier circuitry for developing a DC voltage related to the rate of said output signals, said DC voltage coupled to said voltage variable impedance for control thereof to substantially reduce the AC gain of said amplifier in response to the rate of said output signals being above a predetermined rate, whereby said gate control signals are produced for blanking noise on said received signals only when noise occurs at a rate below a predetermined rate.

2. A noise blanker circuit according to claim 1 wherein said amplifier has an output and an input and biasing circuitry, and wherein said voltage variable impedance is AC capacitively coupled between the output and input of said amplifier such that the bias of said amplifier is independent of said noise related DC voltage.

3. A noise blanker circuit according to claim 2 wherein said amplifier includes a transistor and said voltage variable impedance is capacitively coupled between a first capacitor coupled to the collector of said transistor and a second capacitor coupled to the base of said transistor.

4. A noise blanker circuit according to claim 3 wherein said rectifier circuitry includes a diode coupled to the junction between said second capacitor and said voltage variable impedance, whereby said diode rectifies signals present at the base of said transistor which are coupled to the diode through said second capacitor.

5. A noise blanker circuit according to claim 4 wherein said voltage variable impedance comprises a varactor diode.

6. A noise blanker circuit according to claim 5 which includes biasing means for said varactor diode such that a reverse bias is applied to said varactor diode whenever noise is absent from said received signal for a substantial period of time.

7. A noise blanker circuit according to claim 6 wherein said noise detector means includes at least one differentiating curcuit.

8. A noise blanker circuit according to claim 7 wherein said gate means includes a switch means followed by a holding capacitor which maintains the output of said switch means at substantially its last value when said switch means is opened in response to said control signals.

9. A noise blanker circuit according to claim 8 wherein said switch means comprises a transistor wherein said control signals are received by the base terminal of said switch means transistor.

10. A noise blanker circuit according to claim 9 wherein said transistor switch means selectively passes said received signal from its collector terminal to its emitter terminal in response to said control means and wherein said holding capacitor is coupled to said emitter terminal of said transistor switch means.

* * * * *